(12) United States Patent
Li et al.

(10) Patent No.: US 10,288,703 B2
(45) Date of Patent: May 14, 2019

(54) MRI METHOD OF HYBRID ACQUISITION IN 3D TSE

(71) Applicant: Albert-Ludwigs-Universitaet Freiburg, Freiburg (DE)

(72) Inventors: Guobin Li, Freiburg (DE); Maxim Zaitsev, Freiburg (DE); Juergen Hennig, Freiburg (DE)

(73) Assignee: Albert-Ludwigs-Universitaet Freiburg, Freiburg (DE)

( * ) Notice: Subject to any disclaimer, the term of this patent is extended or adjusted under 35 U.S.C. 154(b) by 795 days.

(21) Appl. No.: 14/675,782

(22) Filed: Apr. 1, 2015

(65) Prior Publication Data

US 2015/0301136 A1  Oct. 22, 2015

(30) Foreign Application Priority Data

Apr. 17, 2014 (EP) .................................. 14165064

(51) Int. Cl.
*G01R 33/48* (2006.01)
*G01R 33/56* (2006.01)
*G01R 33/385* (2006.01)
*G01R 33/561* (2006.01)

(52) U.S. Cl.
CPC ....... *G01R 33/4828* (2013.01); *G01R 33/385* (2013.01); *G01R 33/4822* (2013.01); *G01R 33/5608* (2013.01); *G01R 33/5613* (2013.01); *G01R 33/5614* (2013.01); *G01R 33/5617* (2013.01); *G01R 33/5618* (2013.01)

(58) Field of Classification Search
CPC .............. G01R 33/385; G01R 33/4822; G01R 33/4828; G01R 33/5608; G01R 33/5613; G01R 33/5615; G01R 33/5614; G01R 33/5617; G01R 33/5618
See application file for complete search history.

(56) References Cited

U.S. PATENT DOCUMENTS

| 6,400,151 B1 | 6/2002 | Haase | |
|---|---|---|---|
| 2009/0143666 A1* | 6/2009 | Edelman | A61B 5/055 600/410 |
| 2014/0285195 A1* | 9/2014 | Stemmer | G01R 33/4818 324/309 |
| 2015/0051474 A1* | 2/2015 | Eggers | G01R 33/5605 600/410 |
| 2016/0033606 A1* | 2/2016 | Eggers | G01R 33/4828 324/309 |

OTHER PUBLICATIONS

"GRE Acronyms" by Ad Elster, Elster LLC. 2017. <http://mriquestions.com/commercial-acronyms.html>.*
P.C. Lauterbur "Image Formation by Induced Local Interactions . . . ", Nature vol. 242, Mar. 16, 1973.

(Continued)

*Primary Examiner* — Rishi R Patel
(74) *Attorney, Agent, or Firm* — Paul Vincent

(57) ABSTRACT

A method for accelerating magnetic resonance imaging is proposed. In 3D MRI, the method utilizes two sub-echo-trains in each repetition time for the simultaneous acquisition of two contrasts. The first sub-echo-train is a turbo spin echo train and the second sub-echo-train is a gradient echo train. The method acquires two different contrasts simultaneously in a single acquisition, for example one water image plus one fat image, or one turbo spin echo image plus one susceptibility weighted image.

10 Claims, 2 Drawing Sheets

(56) References Cited

OTHER PUBLICATIONS

Hoonjae Lee et al., "Rapid hybrid encoding for high-resolution . . . ", NMR Biomed. 2013; 26: 1751-1761.
Richard Winkelmann et al., "Dual-contrast single breath-hold 3D . . . ", Magn Reson Mater Phy (2006) 19:297-304.
U. Blume et al., "Interleaved $T_1$- and $T_2$- weighted imaging", Proc. Intl. Soc. Mag. Reson. Med. 15 (2007).
J. Hennig et al:, "RARE imaging: A fast imaging method for clinical MR". Magn Reson Med, 3: 823-833, 1986.
JP. Mugler, "Optimized three-dimensional fast-spin-echo MRI". J Magn Reson Imaging. Apr. 2014;39(4):745-67.
Klaus Scheffler et al., "T1 Quantification With Inversion Recovery TrueFISP", Magn. Reson. Med 45:720-723 (2001).
R.F. Busse et al., "Flexible and Efficient View Ordering for 3D Sequences with Periodic Signal Modulation". In: Proc 16th Annual Meeting ISMRM, Toronto, p. 837.
E.M. Haacke et al., "Susceptibility weighted imaging (SWI)". Magn Reson Med, 52: 612-618.
Unni K. Udayasankar et al., "Role of Spectral Presaturation Attenuated . . . ", Magn Reson Med, 28: 1133-1140.
K. Scheffler et al., "Reduced circular field-of-view imaging", Magn Reson Med, 40: 474-480. doi: 10.1002/mrm.1910400319, 1998.
J.P. Mugler et al., "Radial Single-slab 3D Turbo Spin Echo (Space)", Proc ISMRM 21 (2013); 2368.
Song Lai et al., "Three-dimensional spiral fMRI technique: A comparison with 2D spiral acquisition", Magn Reson Med, 39: 68-78. doi: 10.1002/mrm.1910390112, 1998.
Koichi Oshio et al., "GRASE (Gradient- and spin-echo) imaging: a novel fast MRI technique", Magn Reson Med. Aug. 1991;20(2):344-9.
Hahnsung Kim et al., "Variable-flip-angle single-slab 3D GRASE imaging with phase-independent image reconstruction", Magn Reson Med. Mar. 17, 2014. doi: 10.1002/mrm.25223.

\* cited by examiner

MRI METHOD OF HYBRID ACQUISITION IN 3D TSE

This application claims Paris convention priority from EP 14 165 064.8 filed Apr. 17, 2014 the entire disclosure of which is hereby incorporated by reference.

BACKGROUND OF THE INVENTION

The present invention relates to a magnetic resonance imaging method for the acquisition of two 3-dimensional datasets, where spatial encoding by three mutually orthogonal magnetic field gradients is performed such that signal is readout under a readout-gradient in one spatial direction k1, and spatial encoding in the other two spatial directions k2, k3 is performed by applying phase encoding gradients in the other two spatial directions prior to signal acquisition, and data acquisition is performed in a sequential manner such that at each acquisition step signal is acquired under said readout-gradient, but with different combinations of the two phase encoding gradients, the method comprising a turbo spin echo train being used to acquire one of the 3-dimensional datasets, whereby
  a single excitation RF pulse is being followed by multiple refocusing RF pulses,
  the time interval between an excitation RF pulse and a first refocusing RF pulse is half of the time interval of two adjacent refocusing RF pulses,
  one k-space readout is acquired in between two refocusing RF pulses,
  phase encoding gradients between each two consecutive refocusing RF pulses are varied to acquire different phase encoding steps,
  a minimum of two echo trains with a waiting time between successive echo trains is being used for the encoding of the 3-dimensional dataset.

A method of this type is known from Klaus Scheffler and Jürgen Hennig Magn. Reson. Med 45:720-723 (2001) (=Reference [3]).

The present invention relates generally to magnetic resonance imaging (=MRI) technology. It specifically relates to data acquisition methods for MRI.

Magnetic resonance imaging is a relative new technology compared with computed tomography (=CT) and the first MR Image was published in 1973 by P. C. Lauterbur in "Image Formation by Induced Local Interactions: Examples of Employing Nuclear Magnetic Resonance", Nature 242, 190491. It is primarily a medical imaging technique which most commonly used in radiology to visualize the structure and function of the body. It could provide detailed Images of the body in any plane. MRI provides much greater contrast between the different soft tissues of the body than CT does, making it especially useful in neurological, cardiovascular, and oncological imaging. It uses a powerful magnetic field to align the nuclear magnetization of hydrogen atoms in water in the body. Radio frequency fields are used to systematically alter the alignment of this magnetization, causing the hydrogen nuclei to produce a rotating magnetic field detectable by the scanner. This signal can be manipulated by additional magnetic fields to build up enough information to reconstruct an image of the body.

An MRI system typically establishes a homogenous magnetic field, generally along a central axis of a subject undergoing an MRI procedure. This homogenous main magnetic field affects the magnetic properties of the subject to be imaged by aligning the nuclear spins, in atoms and molecules forming the body tissue. If the orientation of the nuclear spins is perturbed out of alignment, the nuclei attempt to realign their spins with the field. Perturbation of the orientation of the nuclear spins is typically caused by application of radio frequency (RF) pulses tuned to the Larmor frequency of the material of interest. During the realignment process, the nuclei precess about the direction of the main magnetic field and emit electromagnetic signals that may be detected by one or more RF detector coils placed on or around the subject.

Magnetic resonance imaging employs temporally and spatially variable magnetic fields to encode position by affecting the local Larmor frequency of spins. Gradient coils typically used for that purpose generate spatial encoding magnetic fields (=SEMs) which are superimposed on the main magnetic field. This allows to choose the localization of the image slices and also to provide phase encoding and frequency encoding. This encoding permits identification of the origin of resonance signals during image reconstruction. The image quality and resolution depends significantly on the strength and how the applied encoding fields can be controlled. Control of the gradient coils is generally performed in accordance with pre-established protocols or sequences at events, called pulse sequences, permitting different types of contrast mechanisms to be imaged.

In 3D turbo spin echo (aka TSE, FSE, RARE, SPACE) sequence (see References [1, 2]), long repetition time TR is usually used in T2 weighted imaging and proton-density weighted imaging. To reduce image blurring caused by signal decay in a series of acquired echoes in each repetition time TR, relative short echo train length is used, which results in low time utilization ratio: Only a small portion of the repetition time TR is used to acquire data, and the rest of the time is purely spent waiting for signal recovery (referred to as "waiting time" in following sections).

Non-selective refocusing RF pulses with variable flip angles were used to achieve short echo spacing, and enable 3D TSE imaging with relative longer echo trains. However, the typical time utilization ratio was still below 30% in typical examinations.

The application of multiple slab acquisition in 3D TSE imaging was employed to improve the time utilization by applying interleaved multi-slab excitation in each TR. However, the combined 3D image from multi-slab acquisition is prone to slab boundary artifacts, caused by spatially varying RF excitation profiles.

The present invention presents a way to substantially overcome one or more of the disadvantages in the existing methods of prior art discussed above.

A specific object of the present invention is to propose a data acquisition method in MRI, where the data are acquired by repeating the timing of a series of RF pulses and varying the spatial phase encoding steps of the readouts. The time interval between two consecutive applications of the same series of RF pulses is referred to as the repetition time TR.

SUMMARY OF THE INVENTION

These objects are achieved by modifying the method discussed above in that during the waiting time an additional gradient echo train is used to acquire one of the 3-dimensional datasets, comprising one excitation RF pulse being followed by a single or multiple k-space readouts, the echo in the center of readout being formed by nulling the gradient moments applied after each excitation pulse in frequency encoding direction, the gradient echo train comprising a series of repetitions of said excitation RF pulse and the k-space readouts with varying spatial phase encoding steps;

and that the simultaneous acquisition of two 3-dimensional datasets using both turbo spin echo train and gradient echo train is achieved by repeating the said timing of a series of RF pulses and gradients comprising two sub-echo-trains which are applied in chronological order in each repetition; until all data necessary to reconstruct a 3-dimensional dataset have been acquired in each of the sub-echo trains.

In the current prior art implementation of 3D turbo spin echo sequences the repetition time TR is typically much longer than the duration of the echo train. This is caused by the fact, that the z-magnetization of spins is severely saturated by the multiple refocusing pulses used to generate the echo train. Therefore a considerable waiting time has to be introduced in order to retrieve sufficient magnetization for the next excitation by T1-relaxation. As an illustrative and typical value, the duration of an echo train with 64 echoes and an echo spacing of 4 ms is 256 ms compared to a typical TR of 1500-2500 ms. In consequence the large majority of the total acquisition time is spend by waiting for magnetization to recover.

The idea of the invention is to fill this waiting time with data acquisition using an imaging sequence, which does not or only minimally interfere with the T1-recovery of spins. This is achieved by using gradient echo (low flip angle FLASH or trueFISP) sequences, which are known to only minimally with T1-recovery (see Reference [3]).

In each said repetition time TR, a turbo spin echo train is applied first, followed by a gradient echo train. In said TR it thus comprises two sub-echo-trains. The two sub-echo-trains are applied in chronological order (referred to as the first sub-echo-train and the second sub-echo-train respectively).

The said first sub-echo-train is a turbo spin echo train, characterized by the following features:
  A single excitation RF pulse is followed by a series of refocusing RF pulses
  The time interval between the excitation RF pulse and the first refocusing RF pulse is half of the time interval of two adjacent refocusing RF pulses.
  One k-space readout is acquired in between two refocusing RF pulses.
  Phase encoding gradients in between two refocusing RF pulses are varied to acquire different phase encoding steps.

The said second sub-echo-train is a gradient echo train, characterized by the following features:
  One excitation RF pulse is followed by a single or multiple k-space readouts.
  The echo in the center of readout is formalized by nulling the gradient moments applied after each excitation pulse in frequency encoding direction.
  The gradient echo train consists of a series of repetitions of the said excitation pulse and the k-space readouts with varying spatial phase encoding steps.
  Phase encoding is applied in each echo before signal readout, a phase encoding rewinder is applied after each echo such that the spin system reaches an identical dephasing state before the next pulse with respect to all three gradients.
  For a trueFISP implementation the gradient moment of all gradients is nulled between successive pulses.

The time interval between two adjacent refocusing RF pulses in said first sub-echo-train and the time interval between two excitation RF pulses in said second sub-echo-train is referred to as echo spacing.

The acquired data in said first sub-echo-train is filled to the first k-space data set to reconstruct one image.

The acquired data in said second sub-echo-train is filled to the second k-space data set to reconstruct another image.

The methods of filling k-space in said first sub-echo-train and said second sub-echo-train are independent of each other. For example, rectilinear view ordering in ky-kz plane can be applied in said first sub-echo-train, and pseudo radial view ordering in ky-kz plane can be applied in said second sub-echo-train simultaneously (see Reference [4]).

This interleaved acquisition method is preferred to be applied in 3D MRI, but not limited to 3D MRI.

Thus, the present invention suggests a method for accelerating magnetic resonance imaging, comprising: In 3D MRI, it comprises two sub-echo-trains in each repetition time for the simultaneous acquisition of two contrasts. The first sub-echo-train is turbo spin echo train. The second sub-echo-train is gradient echo train. The invented method acquires two different contrasts simultaneously in a single acquisition, for example one water image plus one fat image, or one turbo spin echo image plus one susceptibility weighted image.

While only certain features of the invention have been illustrated and described herein, many modifications and changes will occur to those skilled in the art. It is, therefore, to be understood that the appended claims are intended to cover all such modifications and changes as all within the true spirit of the invention.

These, as well as other objects and advantages of this invention can be better understood and appreciated through careful study of the following detailed description of presently preferred exemplary embodiments of this invention in conjunction with the accompanying drawing.

In order to make the aforesaid and other features and advantages of the present invention more apparent to those skilled in the art, preferred embodiments of the present invention will be described in detail below by referring to the accompanying drawings, wherein identical numerals represent the same parts.

DESCRIPTION OF THE PREFERRED EMBODIMENT

Figure 1:
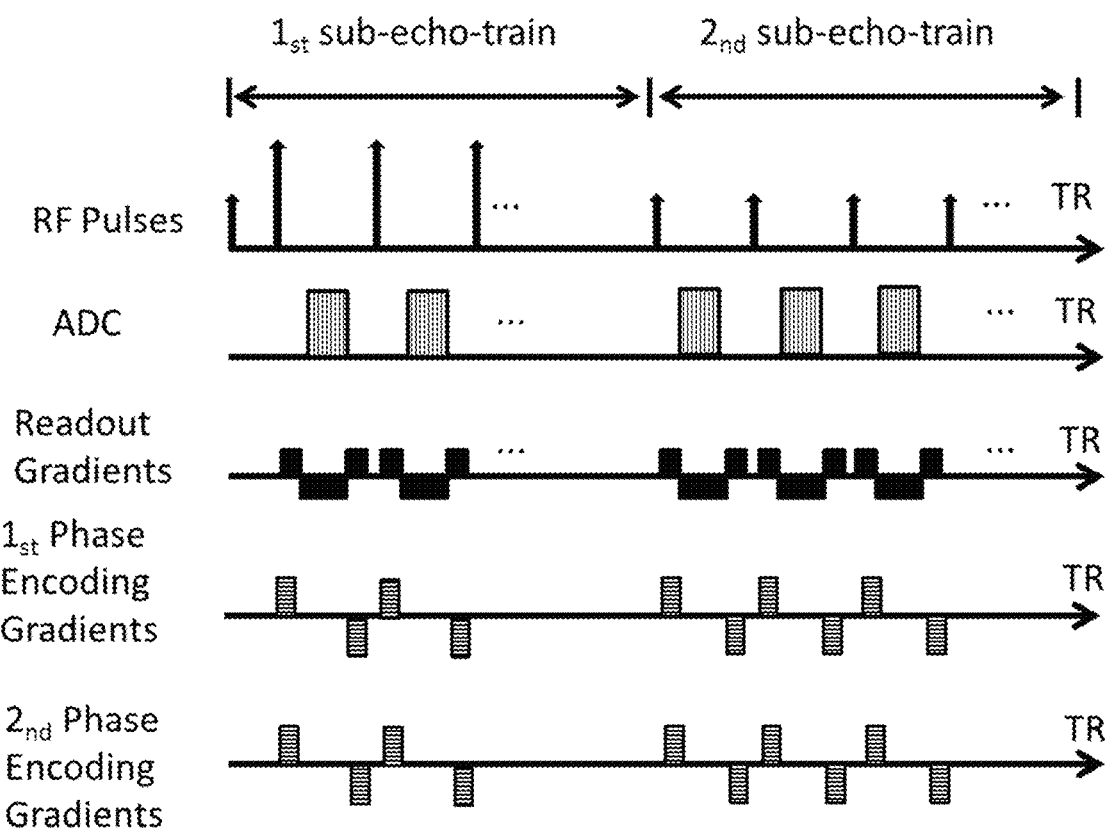
FIG. 1 shows a sequence timing diagram of each TR with two sub echo trains for Cartesian k-space acquisition according to the present invention.
Figure 2:
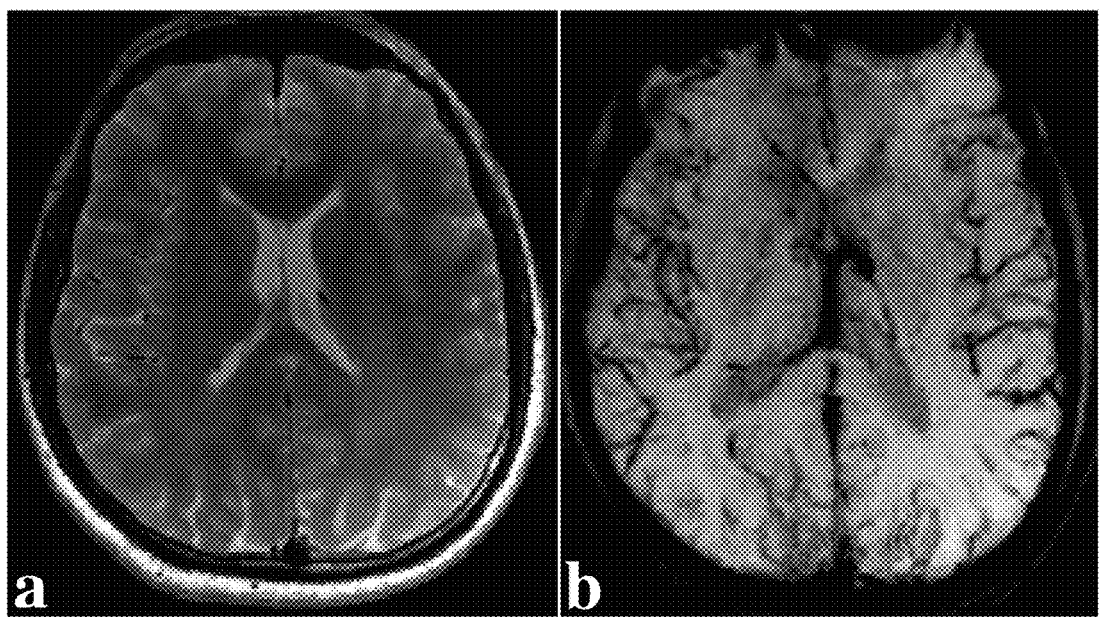
FIG. 2 shows simultaneous acquisition of two contrasts:
a) T2 weighted image reconstructed using the data acquired in the first sub-echo-train;
b) susceptibility weighted image reconstructed using the data acquired in the second sub-echo-train.
Figure 3:
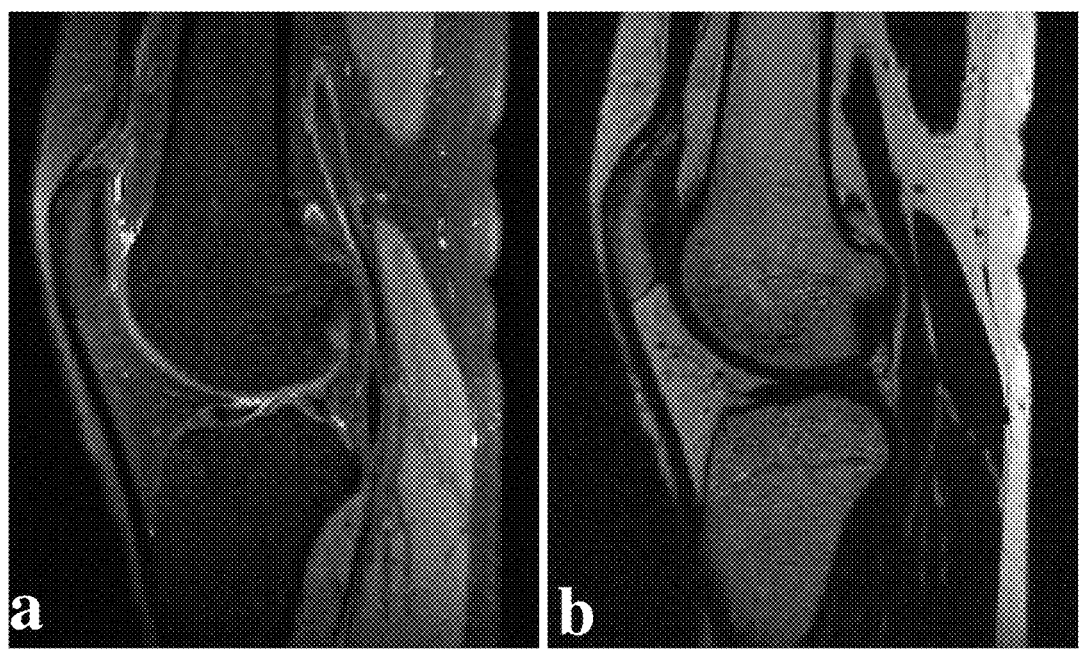
FIG. 3 shows simultaneous acquisition of two contrasts:
a) fat suppressed image reconstructed using the data acquired in the first sub-echo-train;
b) fat excited image reconstructed using the data acquired in the second sub-echo-train.

In a first implementation, the TSE-readout of the first sub-echo-train is accompanied by a low flip angle FLASH sequence with flip angles typically below 20°. As an example, the first sub-echo-train can be implemented such, that a T2-weighted data set is created, the images created by the second sub-echo-train will be proton density weighted, such that images with two different contrast are generated. With proper choice of slice selection-, readout-, and phase encoding gradient images will have identical geometric parameters allowing a direct pixel-by-pixel comparison.

In a further embodiment of the invention, the second sub-echo-train comprises a gradient echo sequence, in which the total gradient moment of the phase encoding gradient between successive pulses is zero, which is achieved by applying a phase encoding rewinding gradient after the readout of the echo.

The advantage of applying a phase encoding rewinding gradient is that: the influence of the changing phase encoding gradients between successive pulses on the signal evolution is cancelled. The imaging method is more robust to artifacts, caused by system imperfection.

In an alternative embodiment of the invention, the second sub-echo-train comprises a gradient echo sequence called "true FISP sequence", in which the total gradient moment of all gradients between successive pulses is zero, which is achieved by applying rewinding gradients in all three directions thereby effecting slice selection, readout and phase encoding.

The application of rewinding gradients in all three directions results in high signal-to-noise ratio (SNR) and shorter acquisition time.

In a further and preferred implementation data in said second sub-echo-train is acquired with relative long echo spacing (for example >10 ms) to obtain susceptibility weighted images (see Reference [5]).

In a further and preferred implementation different chemically selective excitations are applied in two sub-echo-trains, for example water signal is excited in said first sub-echo-train, and fat signal excited in said second sub-echo-train, or vice versa.

In a further and preferred implementation fat signal in said first sub-echo-train is suppressed by extra procedure applied before the excitation pulse, for example SPAIR fat suppression (see Reference [6]). Fat signal in said second sub-echo-train is excited.

In a further and preferred implementation: In said second sub-echo-train, the data acquired at the beginning is filled into peripheral part of k-space, and the data acquired at the end is filled into inner part of k-space.

In a further and preferred implementation: pseudo radial view ordering in ky-kz plane is applied in said second sub-echo-train (see Reference [4]).

Furthermore it should be noted, that the acquisition scheme is not limited to Fourier encoding using readout- and phase encoding respectively for two- or three-dimensional encoding, but can be applied equally well to other encoding schemes, where one or both of the sub-echo-trains are encoded using radial encoding or spiral encoding or other encoding schemes know from literature (see References [7-9]).

Also the first sub-echo-train can be implemented such, that multiple gradient echoes are created according to the principles of the GRASE-technique (see References [10, 11]).

REFERENCES

[1] Hennig, J., Nauerth, A. and Friedburg, H. (1986), RARE imaging: A fast imaging method for clinical MR. Magn Reson Med, 3: 823-833
[2] Mugler J P. Optimized three-dimensional fast-spin-echo MRI. J Magn Reson Imaging. 2014 April; 39(4):745-67
[3] Klaus Scheffler and Jürgen Hennig Magn. Reson. Med 45:720-723 (2001)
[4] Busse, R. F., Brau, A. C., Beatty P. J., Bayram, E., Michelich, C. R., Kijowski, R., and Rowley, H. A. (2008), Flexible and Efficient View Ordering for 3D Sequences with Periodic Signal Modulation. In: Proc 16th Annual Meeting ISMRM, Toronto, p 837
[5] Haacke, E. M., Xu, Y., Cheng, Y.-C. N. and Reichenbach, J. R. (2004), Susceptibility weighted imaging (SWI). Magn Reson Med, 52: 612-618
[6] Udayasankar, U. K. J. Magn. Reson. Imaging, 28: 1133-1140
[7] Scheffler, K. and Hennig, J. (1998), Reduced circular field-of-view imaging Magn Reson Med, 40: 474-480. doi: 10.1002/mrm.1910400319
[8] Mugler J P et al. Proc ISMRM 21 (2013); 2368
[9] Lai, S. and Glover, G. H. (1998), Three-dimensional spiral fMRI technique: A comparison with 2D spiral acquisition. Magn Reson Med, 39: 68-78. doi: 10.1002/mrm.1910390112
[10] Oshio K1, Feinberg D A. GRASE (Gradient- and spin-echo) imaging: a novel fast MRI technique. Magn Reson Med. 1991 August; 20(2):344-9
[11] Kim H, Kim D H, Park J. Variable-flip-angle single-slab 3D GRASE imaging with phase-independent image reconstruction. Magn Reson Med. 2014 Mar. 17. doi: 10.1002/mrm.25223. [Epub ahead of print]

We claim:

1. A magnetic resonance imaging method for the acquisition of two 3-dimensional datasets, where spatial encoding by three mutually orthogonal magnetic field gradients is performed such that signal is readout under a readout-gradient in one spatial direction k1, and spatial encoding in two other spatial directions k2, k3 is performed by applying two phase encoding gradients in the two other spatial directions prior to signal acquisition, wherein data acquisition is performed in a sequential manner such that, at each acquisition step, a signal is acquired under the readout-gradient, but with different combinations of the two phase encoding gradients, the method comprising the steps of:
    a) applying a single excitation RF pulse followed by multiple refocusing RF pulses in a turbo spin echo train to acquire a first 3-dimensional dataset, wherein, a time interval between an excitation RF pulse and a first refocusing RF pulse is half of a time interval between two adjacent refocusing RF pulses;
    b) acquiring one k-space readout between each pair of consecutive refocusing RF pulses;
    c) varying phase encoding gradients between each two consecutive refocusing RF pulses to acquire different phase encoding steps;
    d) introducing a waiting time between two successive turbo spin echo trains for encoding of the first 3-dimensional dataset;
    e) applying, during the waiting time of step d), one excitation RF pulse followed by a single or multiple k-space readouts in a gradient spin echo train to acquire a second 3-dimensional dataset, wherein the second 3-dimensional dataset spatially overlaps with the first 3-dimensional data set;
    f) forming an echo in a center of readout in the gradient spin echo train by nulling gradient moments applied after each excitation pulse in a frequency encoding direction;
    g) repeating steps e) and f) in the gradient spin echo train with varying spatial phase encoding steps; and
    h) repeating steps a) through g) for interleaved acquisition of the first and second 3-dimensional datasets using both the turbo spin echo train and the gradient spin echo train by repeated application of a series of RF pulses and gradients comprising the turbo spin echo train and the gradient spin echo train applied in chronological order in each repetition until all data necessary to reconstruct the first 3-dimensional data set is acquired in the turbo spin echo train and all data necessary to reconstruct the second 3-dimensional dataset is acquired in the gradient spin echo train.

2. The method of claim 1, wherein the gradient spin echo train comprises a gradient echo sequence, in which a total gradient moment of a phase encoding gradient between successive pulses is zero, which is achieved by applying a phase encoding rewinding gradient after readout of an echo.

3. The method of claim 1, wherein the gradient spin echo train comprises a gradient echo sequence called TrueFISP sequence, in which a total gradient moment of all gradients between successive pulses is zero, which is achieved by applying rewinding gradients in all three directions thereby effecting slice selection, readout and phase encoding.

4. The method of claim 1, wherein different chemically selective excitations are applied in the turbo and gradient spin echo trains.

5. The method of claim 4, wherein a water signal is excited in the turbo spin echo train and a fat signal is excited in the gradient spin echo train or vice versa.

6. The method of claim 5, wherein a fat signal in the turbo spin echo train is suppressed by spectrally fat suppression techniques and a fat signal in the gradient spin echo train is excited.

7. The method of claim 1, wherein long echo spacing in the gradient spin echo train is applied to obtain susceptibility weighted images.

8. The method of claim 1, wherein spatial encoding for a signal of at least one of the turbo spin echo train and the gradient spin echo train is performed using radial encoding.

9. The method of claim 1, wherein spatial encoding for a signal of at least one of the turbo spin echo train and the gradient spin echo train is performed using spiral encoding.

10. The method of claim 1, wherein, in the turbo spin echo train, multiple gradient echoes are readout between successive refocusing pulses according to a GRASE-sequence.

* * * * *